United States Patent
Itagaki

(10) Patent No.: US 8,384,382 B2
(45) Date of Patent: Feb. 26, 2013

(54) MAGNETIC RESONANCE IMAGING APPARATUS

(75) Inventor: Hiroyuki Itagaki, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 147 days.

(21) Appl. No.: 12/738,571

(22) PCT Filed: Oct. 15, 2008

(86) PCT No.: PCT/JP2008/068619
§ 371 (c)(1), (2), (4) Date: Apr. 16, 2010

(87) PCT Pub. No.: WO2009/051123
PCT Pub. Date: Apr. 23, 2009

(65) Prior Publication Data
US 2010/0290682 A1   Nov. 18, 2010

(30) Foreign Application Priority Data

Oct. 18, 2007   (JP) ................................. 2007-271215

(51) Int. Cl.
*G01V 3/00* (2006.01)

(52) U.S. Cl. ....................................................... 324/307

(58) Field of Classification Search .......... 324/300–322; 600/407–445; 174/110 R, 113 R, 28, 27, 174/116
See application file for complete search history.

(56) References Cited

U.S. PATENT DOCUMENTS

| 6,704,594 | B1* | 3/2004 | Blank et al. .................... 600/423 |
| 7,622,926 | B2* | 11/2009 | Taniguchi et al. ............. 324/318 |
| 7,723,987 | B2* | 5/2010 | Bito et al. ...................... 324/309 |
| 7,755,356 | B1* | 7/2010 | Shenoy .......................... 324/309 |
| 7,843,195 | B2* | 11/2010 | Ruhm ............................. 324/309 |
| 7,868,618 | B2* | 1/2011 | Taniguchi et al. ............ 324/318 |
| 2001/0031037 | A1 | 10/2001 | Prince et al. |
| 2005/0189942 | A1 | 9/2005 | Tsao et al. |
| 2012/0016224 | A1* | 1/2012 | Schmitt ......................... 600/410 |

OTHER PUBLICATIONS

International Search Report in connection with International Application No. PCT/JP2008/068619, Oct. 15, 2008.
J. Andrew Derbyshire et al., "Cardiac Motion Encoding using HARP and DENSE: Tagging or Phase Contrast?", Proc. Intl. Soc. Mag. Reson. Med. 9 (2001).
S. Ryf et al., "Peak-Combination HARP for Increased Reproducibility of Tagging Analysis", Proc. Intl. Soc. Mag. Reson. Med. 11 (2004).
W. Liu et al., "Fast Imaging of Cardiac Strain Using Partial k-Space HARP in Mice", Proc. Intl. Soc. Mag. Reson. Med. 11 (2004).
V. M. Pai, "PTAGS: Partial k-space tagging combined with SSFP", Proc. Intl. Soc. Mag. Reson. Med. 14 (2006).

* cited by examiner

*Primary Examiner* — Brij Shrivastav
(74) *Attorney, Agent, or Firm* — Cooper & Dunham LLP

(57) ABSTRACT

An imaging pulse sequence includes a tagging sequence for modulating nuclear magnetization of an object to be imaged, and an imaging sequence for non-measurement of a part of k-space data. Control means includes: measurement-requiring region specification means which specifies a measurement region (measurement-requiring region) of the k-space required for reflecting the affect of the modulated nuclear magnetization on the image to be reconstructed; and sequence modification means for modifying the imaging sequence so as to measure the measurement region specified by the measurement requiring region specification means when executing the imaging sequence.

10 Claims, 9 Drawing Sheets

FIG.2
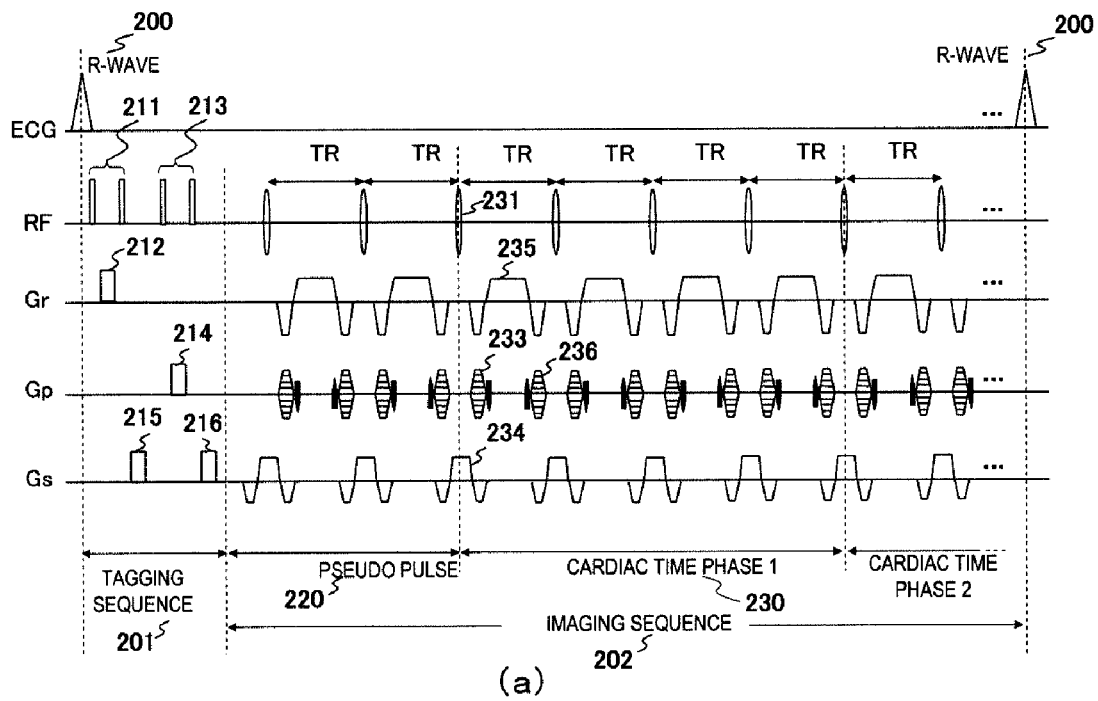
(a)
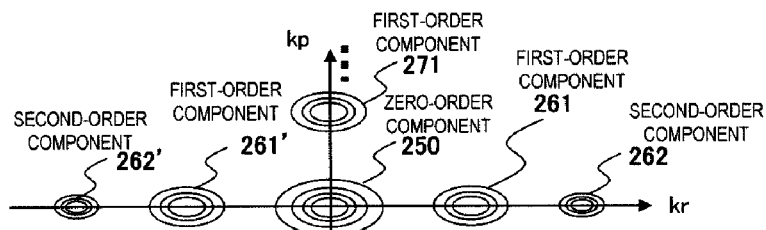
(b)
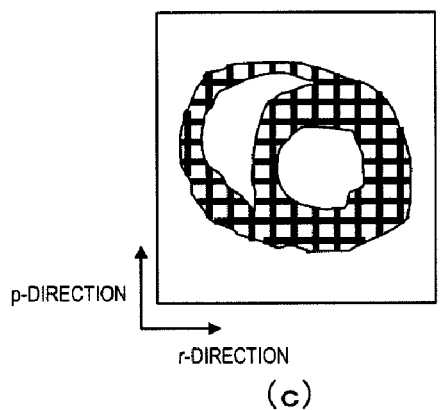
(c)

FIG.3
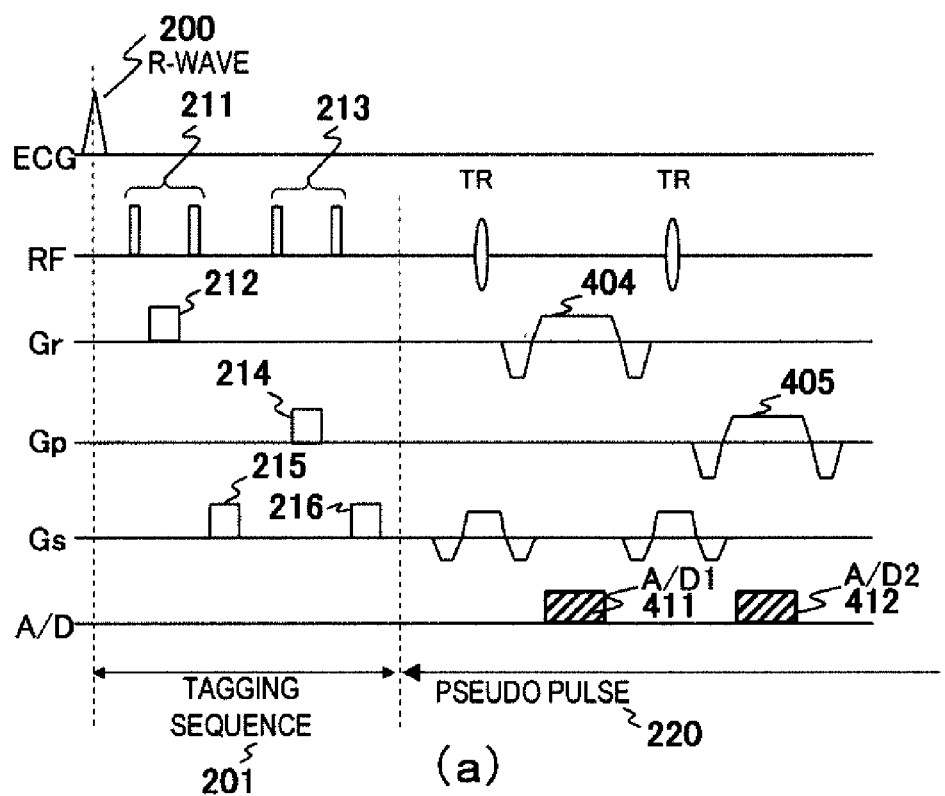
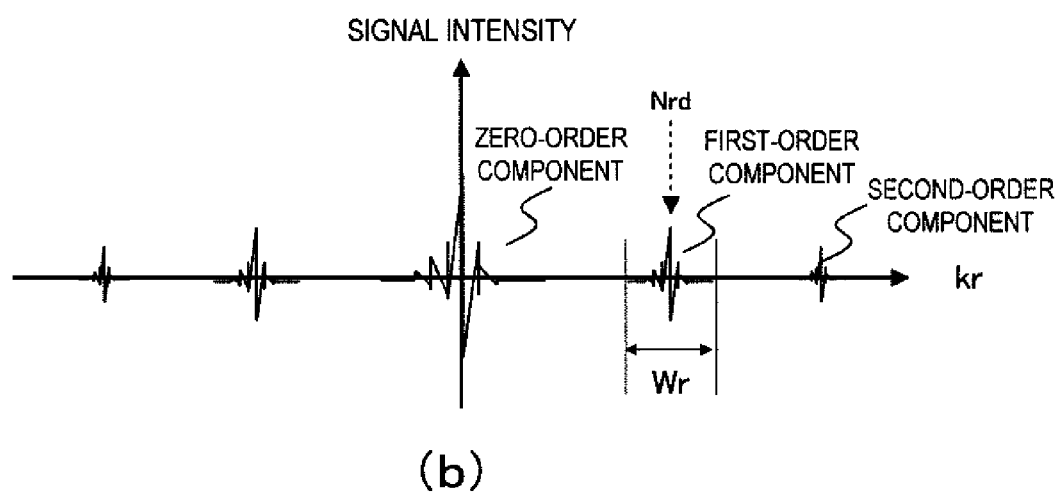

FIG.4
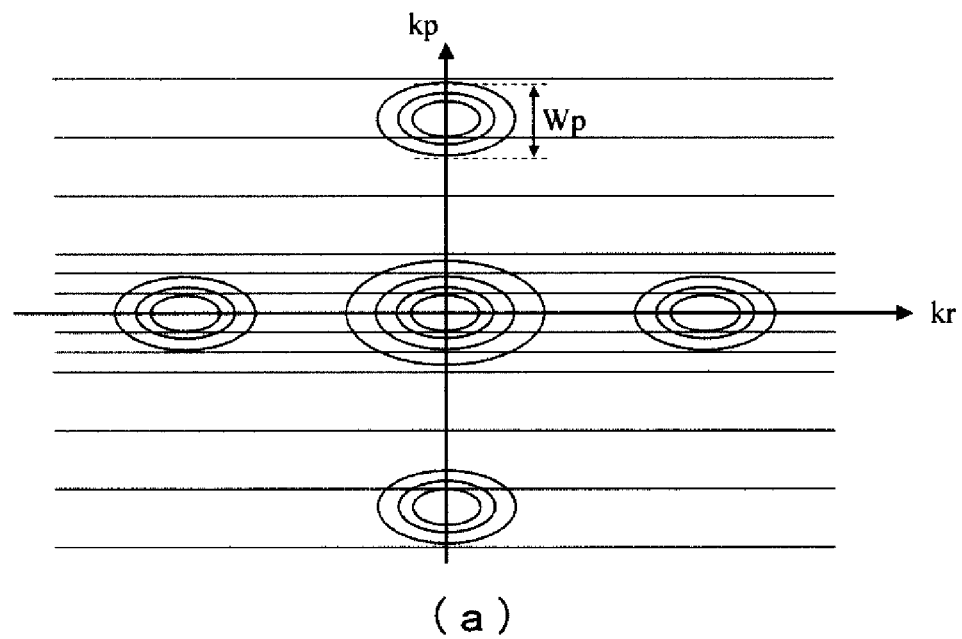
(a)
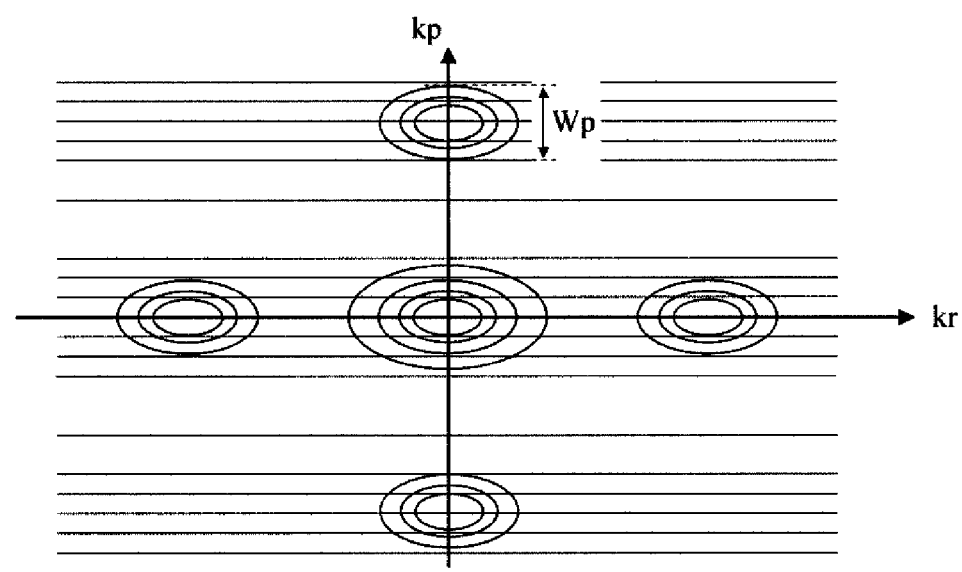
(b)

FIG.8
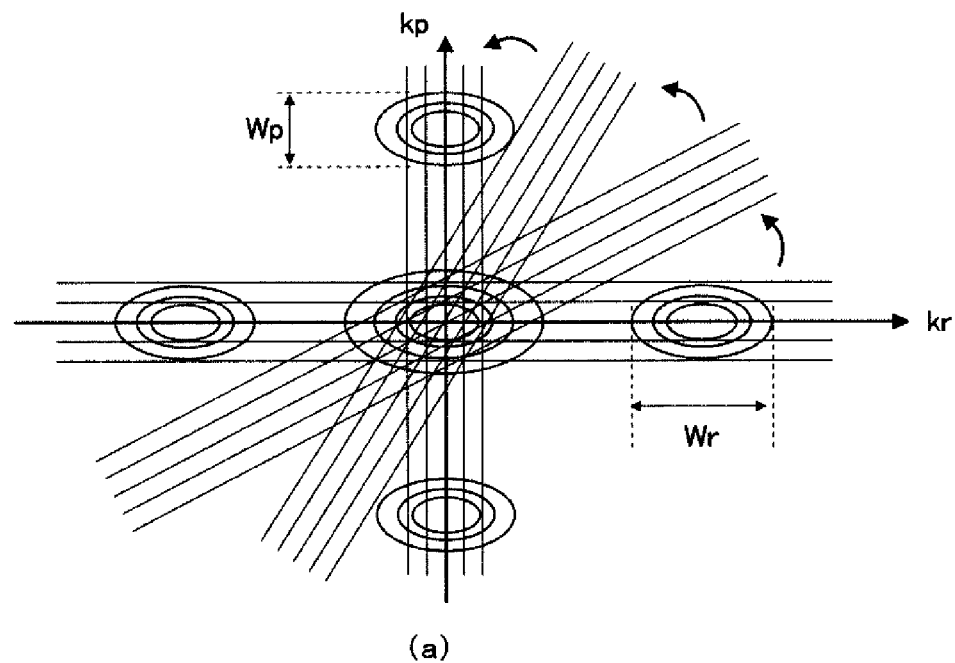
(a)
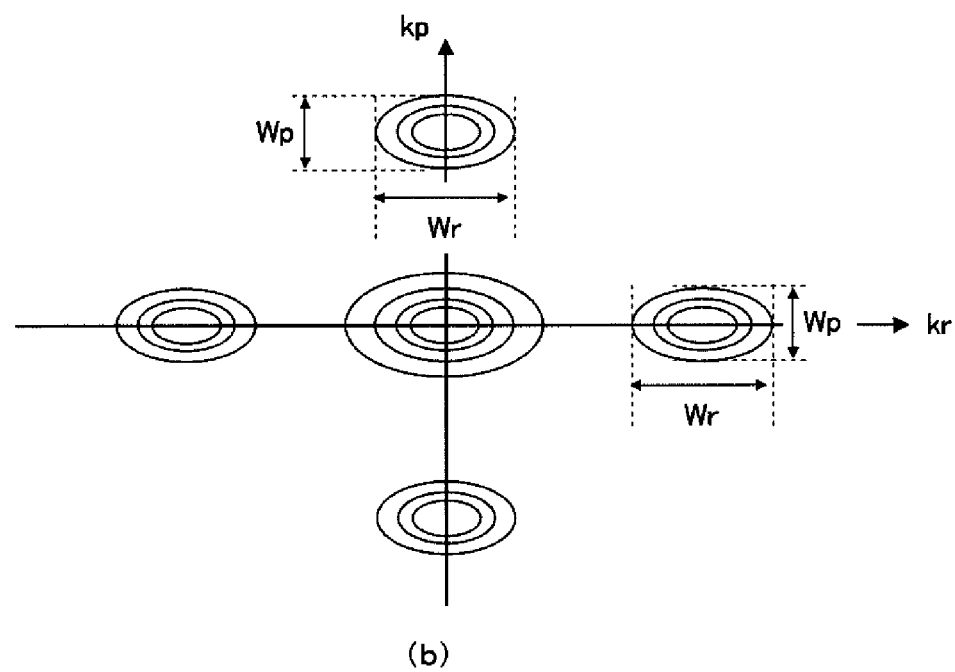
(b)

FIG.9
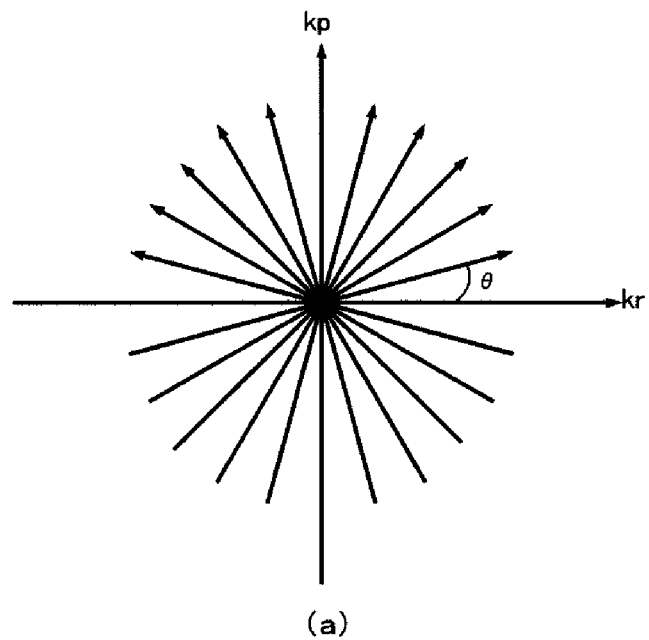
(a)
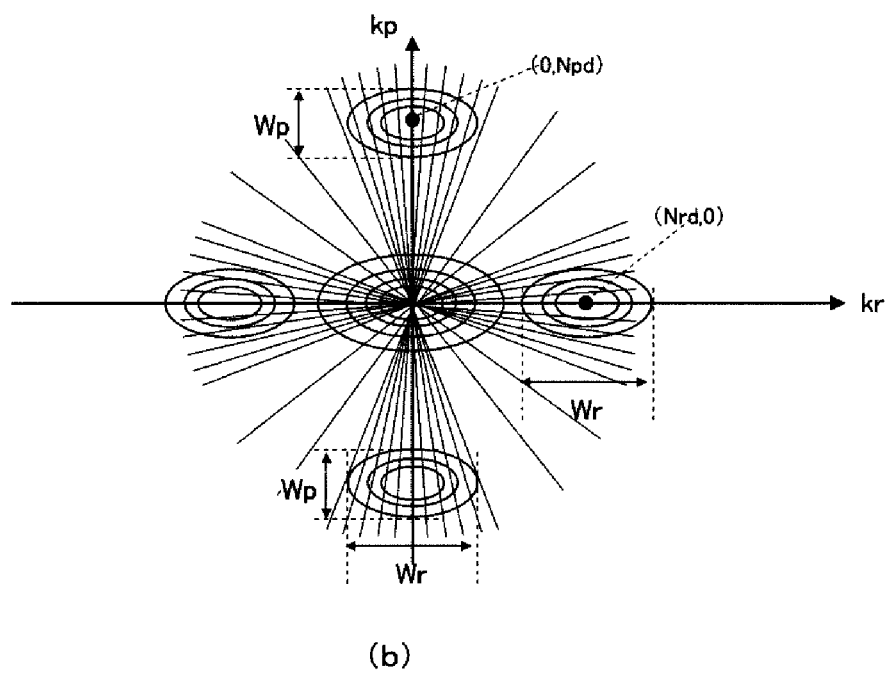
(b)

MAGNETIC RESONANCE IMAGING APPARATUS

TECHNICAL FIELD

The present invention relates to the tagging technique in a magnetic resonance imaging (MRI) apparatus.

BACKGROUND ART

The tagging technique is the commonly known technique to execute imaging after modulating nuclear magnetization on an imaging target by applying a pre-saturation pulse and providing strip or lattice-like tags (magnetic markers) on an MRI image. The sequence for modulating nuclear magnetization of an imaging region is referred to as a tagging sequence. Imaging of, for example, myocardial distortion action can be executed by synchronizing the image acquisition sequence including the tagging sequence (hereinafter referred to as tagging imaging sequence) with an electrocardiographic waveform or pulse waveform of a living organism of an imaging target, obtaining and cine-displaying a plurality of images having different elapsed times from the synchronization timing (cine images).

The method for reconstructing an image from the data acquired by tagging imaging sequence is, for example, the SPAMM (Spatial Modulation of Magnetization) method (for example, refer to Patent Document 1) or the HARP method (for example, refer to Patent Document 2).

On the other hand, increased speed has been demanded in imaging procedure of MRI apparatuses. The conventional techniques for increasing speed are, for example, the parallel imaging method which saves imaging time by reducing the acquisition number of echo signals in the phase encode direction (for example, refer to Patent Document 3), the radial imaging method which saves imaging time by scanning a k-space in a radial pattern so as to reduce data sampling number of a high-frequency region, and the hybrid radial imaging method (for example, refer to Patent Document 4).

Patent Document 1: U.S. Pat. No. 5,054,489
Patent Document 2: WO 2000/09010
Patent Document 3: JP-A-2005-525185
Patent Document 4: JP-A-2004-344183

In the measurement data obtained by executing tagging imaging sequence, the echo signal for measurement and the higher harmonic component equivalent to a higher harmonic which is a pseudo-echo signal by a tagging sequence are generated. A higher harmonic is generated in the same direction as the gradient magnetic field for diphase to be applied during a tagging sequence. In this disclosure, the echo signal having the echo peak at the center of a k-space is referred to as a zero-order component (echo signal of zero-order). While on the other hand, higher harmonics of the echo signal generated by applying the pre-pulse of tagging are referred to as the first-order component and the second-order component of the echo signal or the first-order echo signal and the second-order echo signal, in order that the echo peak thereof is closer to the center of a k-space. In the imaging sequence wherein the pre-pulse of tagging is not applied, the echo signal having only the zero-order component is generated as measurement data.

In a tagging imaging sequence, higher harmonic components also need to be obtained in order to achieve high resolution of an image after being reconstructed and to maintain the tag with clarity. Especially, the first-order component of the echo having high signal intensity is extremely significant. Also in the HAPP method, a phase image is composed of the phase component of the image data obtained by Fourier transforming the first-order component of the echo signal, and the strain amount of a heart wall is derived and quantitatively evaluated. Therefore, highly accurate measurement of higher harmonic components is indispensable. In this manner, the first-order echo signal needs to be measured with high accuracy in a tagging imaging sequence. However, in the techniques for increasing speed such as parallel imaging method or hybrid radial imaging method, increased speed of imaging procedure is achieved by reducing (thinning) the number of data acquired from a predetermined region of a k-space. There is a possibility that the k-space region wherein the peak of the first-order component of the echo signal is generated may be included in the region from which the acquisition data is thinned out. Therefore, the first-order component of the echo signal cannot be measured with high accuracy when these speed-increasing techniques are applied to tagging imaging sequence, and acquisition of tags with clarity or quantitative evaluation cannot be executed appropriately.

In an aspect of this disclosure, there is provided an approach for applying the speed-increasing technique which thins out the measurement of high spatial frequency to the imaging technique which requires measurement of the first-order of the echo signal with high accuracy, without causing deterioration of image quality.

This disclosure presumes from the imaging condition the coordinate of a k-space wherein the peak of the first-order of an echo signal is generated, and controls scanning without reducing the data acquisition number of the region in the vicinity of the relevant coordinate.

In concrete terms, the disclosure provides a magnetic resonance imaging apparatus comprising;

static magnetic field generation means configured to generate a static magnetic field;

gradient magnetic field generation means configured to generate a gradient magnetic field in the directions of a plurality of axes;

high-frequency generation means configured to irradiate a high frequency magnetic field to an imaging target;

signal detection means configured to detect a nuclear magnetic resonance signal produced from the imaging target;

control means configured to execute a predetermined imaging pulse sequence by controlling operation of the gradient magnetic field generation means, high-frequency magnetic field generation means and the signal detection means so as to obtain k-space data; and arithmetic processing means configured to perform arithmetic processing with respect to the k-space data so as to execute image reconstruction, wherein:

the imaging pulse sequence includes a tagging sequence for modulating nuclear magnetization of the imaging target and imaging sequence for making a part of the k-space data not to be measured; and the control means comprises measurement requiring region specification means for specifying the measurement region (measurement requiring region) required for reflecting the affect of the modulated nuclear magnetization on the image to be reconstructed and sequence modification means for modifying the relevant imaging sequence so as to measure the measurement region specified by the measurement requiring region specification means upon execution of the imaging sequence.

In accordance with the aforementioned approach, it is possible to apply the speed-increasing technique for thinning measurement of a high spatial frequency region to the imaging technique which requires the measurement of the first-order component of an echo signal with high accuracy, without causing deterioration of image quality.

BRIEF DESCRIPTION OF THE DIAGRAMS

FIG. 2 is for explaining acquisition of a cine image by tagging imaging sequence.

FIG. 3 is for explaining the method for specifying a measurement requiring region by pre-scan in the first embodiment.

FIG. 4 is for explaining the relationship between k-space configuration in acquisition data and higher harmonic component of an echo signal in the first embodiment.

FIG. 8 is for explaining the relationship between k-space configuration in acquisition data and higher harmonic component of an echo signal in a second embodiment.

FIG. 9 is for explaining the relationship between k-space configuration of acquisition data and a higher harmonic component of an echo signal in a third embodiment.

DESCRIPTION OF REFERENCE NUMERALS

Figure 1:
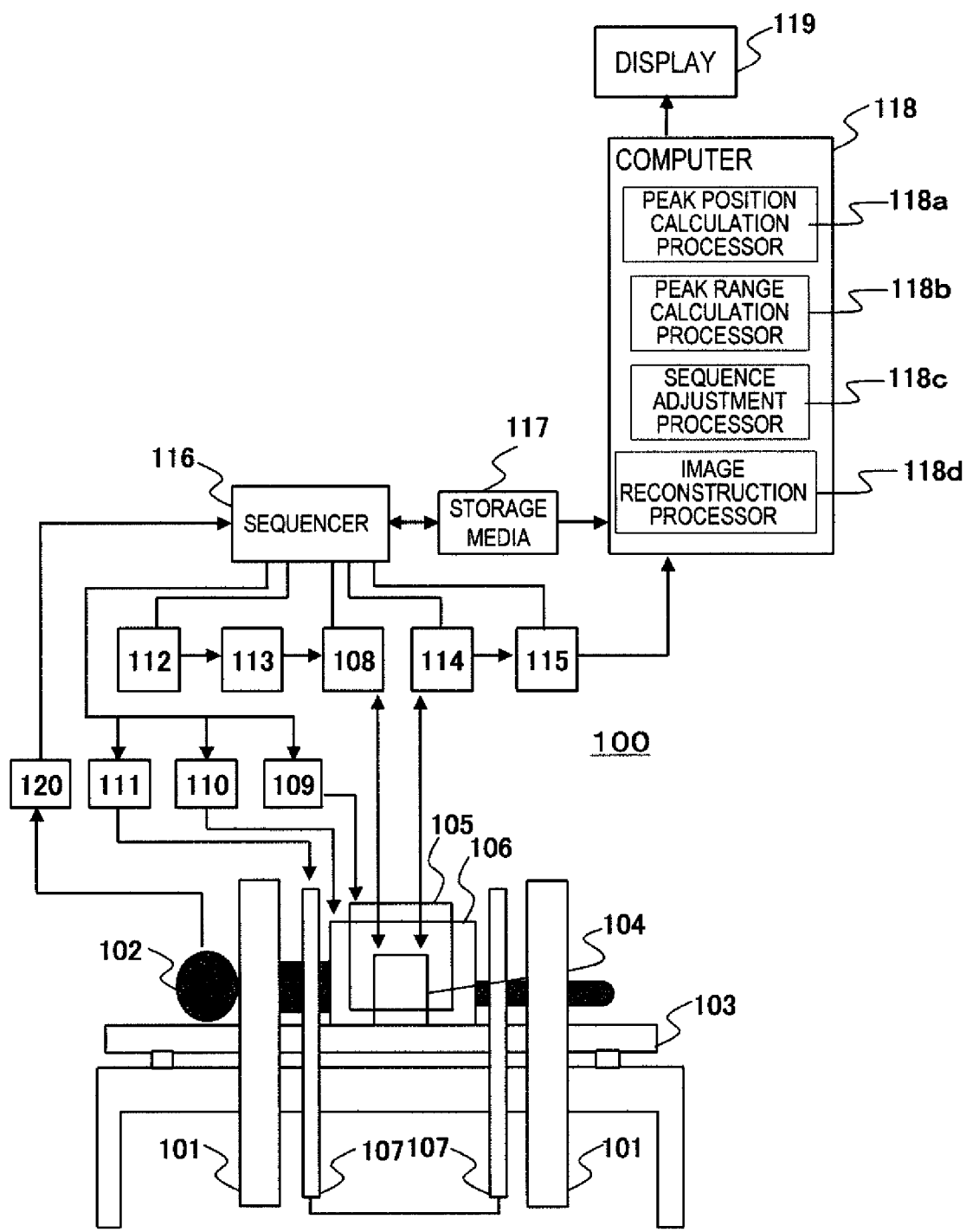
FIG. 1 is a block diagram of the MRI apparatus of a first embodiment.

100: MRI apparatus, 101: static magnetic field generation device, 102: imaging target, 103: bed, 104: RF coil, 105: gradient magnetic field generation coil, 106: gradient magnetic field generation coil, 107: gradient magnetic field generation coil, 108: high-frequency power source, 109: gradient magnetic field power source, 110: gradient magnetic field power source, 111: gradient magnetic field power source, 112: synthesizer, 113: modulator, 114: amplifier, 115: receiver, 116: sequencer, 117: storage media, 118: computer, 119: display

BEST MODE FOR CARRYING OUT THE INVENTION

First Embodiment

The first embodiment to which the present invention is applied will be described below referring to the attached diagrams. In the present embodiment, the parallel imaging method is combined to a tagging imaging sequence. In all diagrams, the places having the same function are appended with the same reference numerals, and repeated explanation thereof will be omitted.

FIG. 1 shows a configuration example of magnetic resonance imaging (hereinafter referred to as MRI) apparatus 100 in the present embodiment. MRI apparatus 100 of the present embodiment comprises static magnetic field generator 101 for generating a static magnetic field in an imaging space, bed 103 for placing imaging target 102 such as a patient to dispose the target in an imaging space, RF coil 104 for applying a high-frequency magnetic field (RF) pulse to imaging target 102 and detecting a nuclear magnetic resonance (NMR) signal, and gradient magnetic field generation coils 105, 106 and 107 for generating a gradient magnetic field to an imaging space in the X-direction, Y-direction and Z-direction respectively.

To RF coil 104, high-frequency power source 108 for providing a high-frequency current for generating an RF pulse and amplifier 114 for amplifying the received NMR signal are connected. To high-frequency power source 108, modulator 113 and oscillator 112 for oscillating a high-frequency signal are connected. To amplifier 114, receiver 115 for A/D converting and detecting the amplified signal is connected. The NMR signal detected by receiver 115 is transferred to computer 118. Computer 118 executes image reconstruction referring to information such as NMR signal received from receiver 115 and data such as imaging condition stored in the connected storage media 117. The reconstructed image is displayed on displayer 119 connected to computer 118. While RF coil 104 is shown for both transmission and reception to simplify the diagram, a transmission coil and a reception coil may be mounted individually. Also, in this embodiment, the reception coil has the configuration that a plurality of coils is juxtaposed in order to apply the parallel imaging method.

To gradient magnetic field generation coils 105, 106 and 107, gradient magnetic field power sources 109, 110 and 111 for providing an electric current are connected respectively. To gradient magnetic field power sources 109, 110 and 111, synthesizer 112, high-frequency power source 108, amplifier 114 and receiver 115, sequencer 116 is connected for controlling their operation. Computer 118 creates an imaging pulse sequence which causes the respective components to operate in a predetermined timing so as to execute a desired method in a desired condition received from an operator, and transfers the created sequence to sequencer 116. Sequencer 116 causes the respective components to operate by outputting a control signal in accordance with the imaging pulse sequence received from computer 118. In the present embodiment, computer 118 receives the command for executing the imaging pulse sequence wherein the sequence using the tagging sequence and cine-image sequence at the same time is combined with the parallel imaging method. By this sequence, imaging construction of distortion action of an imaging target is executed while thinning the measurement of a predetermined region to speedup the construction procedure. Electrocardiograph 120 applied to a patient who is the imaging target 120, is connected to sequencer 116. Sequencer 116 receives the output signal from electrocardiograph 120, and synchronizes the signal to heartbeat period so as to execute the imaging pulse sequence.

Computer 118 of the present embodiment comprises peak position calculation processor 118a configured to calculate the coordinate in a k-space wherein the peak of the first-order component of an echo signal is generated so as to execute the above-mentioned image reconstruction process and creation of an imaging pulse sequence, peak range calculation processor 118b configured to determine the region to be measured without thinning (measurement requiring region) based on the extensity of the first-order component of the echo signal, sequence adjustment processor 118c configured to adjust the imaging pulse sequence stored in a device such as storage media 117 in advance so as to measure the measurement requiring region, and image reconstruction processing 118d configured to reconstruct an image using the acquired echo signal. These processors are implemented by a CPU in computer 118 reading in and executing the program stored in a device such as storage media 117 or a memory (not shown in the diagram).

Prior to the explanation of the detail of the process in the respective components, an example of an imaging pulse sequence will be explained below in the case of imaging the heart of object 102 which is the imaging target by using the tagging sequence and the cine-image sequence being synchronized with the heartbeat period using MRI apparatus 100.

FIG. 2(*a*) shows an imaging pulse sequence in the case of using the tagging sequence and the cine-image sequence being synchronized with the heartbeat period at the same time, FIG. 2(*b*) shows the arrangement of the data acquired in the imaging pulse sequence of FIG. 2(*a*) (row data) in a k-space, and FIG. 2 (*c*) shows a minor-axis image of a heart acquired by the imaging pulse sequence of FIG. 2(*a*). In FIG. 2(*b*), intensity of the data is indicated by a contour line. The minor-axis image of a heart shown in FIG. 2(*c*) is the image on a 2-dimensional plane (XY-plane), and the phase encode direction is set as p-direction and the frequency encode direction is set as r-direction.

The imaging pulse sequence shown in FIG. 2(*a*) executes tagging sequence 201 for creating the tag which is orthogonal to the r-direction and p-direction respectively on the image by synchronizing with electrocardiogram R-wave 200, and scans a cine image of a heart by cine-imaging sequence 202. Actually, the imaging pulse sequence shown in FIG. 2(*a*) is repeatedly executed during breath-holding period while repeating about 10 seconds of breath-holding for 4-6 times, so as to execute scanning of the entire heart.

Tagging sequence 201, in order to execute the tagging in the r-direction and the p-direction respectively, comprises two times of RF pulses 211 for tagging in the r-direction, gradient magnetic field pulse Gr212 in the r-direction, two times of RF pulses 213 for tagging in the p-direction and gradient magnetic field pulse Gp214 in the p-direction. Further, in order to reduce turbulence of nuclear magnetization, it has gradient magnetic field pulses Gs 216 and 216 for a spoiler to be applied in the slice (s) direction.

In cine-image sequence 202, the echo signal is acquired after making the magnetization in a static state. It has pseudo-pulse period 220 immediately after tagging sequence 201, and acquisition period 230 for acquiring the echo signal to be used for image reconstruction of a predetermined number of cardiac time phases. Echo signal acquisition period 230, for example, acquires an echo signal for each repetition time (TR) using a method such as the gradient echo method.

In concrete terms, after RF pulse 231 is applied at the same time as gradient magnetic field pulse 234 for slice selection, gradient magnetic field pulse 233 for phase encode is applied in the p-direction, and echo signal 235 which is generated while applying gradient magnetic field pulse 232 for readout in the r-direct ion is acquired. Then gradient magnetic field pulse 236 for rewinding is applied in the p-direction. This cycle is to be repeated while modifying the phase encode amount for each TR. The image of a plurality of cardiac time phases is obtained by repeating the above-described process until the echo signals for a predetermined number of phase encodes are acquired.

When the imaging pulse sequence including tagging sequence is executed, as shown in FIG. 2(*b*), the pseudo echo generated by RF pulse 211 and gradient magnetic field pulse Gr212 in the r-direction interferes with the echo signal by cine-image sequence 202, and higher harmonic components (excluding zero-order component 250) 261, 262, 261', 262', . . . of the echo signal are generated in the kr-direction in a k-space. In the same manner, higher harmonic components 271, 271', . . . of the echo signal are generated in the kp-direction in the k-space by interference of RF pulse 213 with the pseudo echo generated by gradient magnetic field pulse Gp214 in the p-direction.

From among higher harmonic components of the echo signal, the movement information of the imaging target can be obtained from the first-order component. The HAPP method, using the above-mentioned fact, reconstructs an image by extracting the first-order component of the echo signal in the kr-direction and the kp-direction respectively which are acquired in tagging sequence, and derives the distance in the r-direction and p-direction respectively from the phase map. Then the in-plane distance direction is derived by performing vector synthesis of the distances in two directions, and strain amount is calculated by comparison with the reference image (for example, the image of cardiac phase time 1) so as to compose a strain image.

On the other hand, the parallel imaging method measures the data in the phase encode direction in the k-space by thinning the data to save the measurement time. In the present embodiment, the method among parallel imaging methods is applied which thoroughly measures the data in the low-frequency region and calculates the sensitivity distribution using the measured data. Hereinafter, the method which executes the measurement of the data for calculating sensitivity distribution at the same time as the measurement of the data for an image will be referred to as the parallel imaging method. This method is to be implemented, for example, in the imaging pulse sequence, by applying the gradient magnetic field pulse of the size which increments the phase encode step 1 by 1 to the echo signals from the phase encode 0 to a predetermined phase encode, and applying the phase encode gradient magnetic field of the size which increments the phase encode step by plural numbers to the echo signals that are measured after the predetermined phase encode.

Therefore, in the case that the higher harmonic component of the echo signal is generated in the region being measured by thinning the data, there is a possibility that the resolution will decline and image quality of the tagging image to be reconstructed or accuracy of the strain amount to be calculated by the HAPP method will be deteriorated. In the present embodiment, by peak position calculation processor 118*a*, peak range calculation processor 118*b* and sequence adjustment processor 118*c*, the measurement range in the parallel imaging method is controlled so that the data in which the first-order component having the highest signal intensity is generated would not be missing among the higher harmonic components of the echo signal necessary for maintaining the accuracy in calculation of the resolution and strain amount, etc. Then an image is reconstructed from the echo signal obtained by image reconstruction processor 118*d*. The respective functions thereof will be described below.

Peak position calculation processor 118*a* calculates the position where the peak of the first-order component of the echo signal in the k-space is generated. In accordance of the tagging sequence of the present embodiment, the first-order of an echo signal is generated in the frequency encode direction (kr-direction) and the phase encode direction (kp-direction). First, the procedure for calculating the peak position of the first-order component of the echo signal in the frequency encode direction (kr-direction) will be described.

When gyomagnetic ratio is set as "ν", the intensity of gradient magnetic field Gr in the kr-direction in tagging sequence 201 is set as "Gr(tag)" and the application time of gradient magnetic field Gr in the kr-direction in tagging sequence 201 is set as "T", emission line interval Δr which is the distance between the emission lines having a stripe pattern obtained on the image by tagging sequence 201 with respect to the r-direction can be expressed by (formula 1) using application amount (T·Gr(tag)) of gradient magnetic field Gr in the kr-direction in tagging sequence 201.

$$\Delta r = 2\pi/(\nu \cdot T \cdot Gr(\text{tag})) \quad \text{(formula 1)}$$

The echo peak of the higher harmonic component of the echo signal is the time point that the application amount of the gradient magnetic field from the last echo peak is the same as the application amount of the gradient magnetic field in the same direction upon tagging sequence. More specifically, the echo peak is generated when the application amount of gradient magnetic field Gr in the r-direction from the original point of the k-space (peak position of the zero-order echo signal) to the generation of an echo peak of the first-order of the echo signal and the application amount of gradient magnetic field Gr in tagging sequence 201 (T·Gr(tag)) are the same. Therefore, there is a relationship expressed in (formula 2) among intensity Gr(img) of gradient magnetic field Gr in the r-direction in imaging sequence 202, distance Nr in the kr-direction from the original point in the k-space to the echo peak of the first-order component and sampling rate $\Delta t$.

$$\Delta t \cdot Nr \cdot Gr(\text{img}) = T \cdot Gr(\text{tag}) \qquad \text{(formula 2)}$$

From (formula 1) and (formula 2), distance Nr can be expressed by (formula 3) below.

$$Nr = 2\pi/(v \cdot \Delta r \cdot \Delta t \cdot Gr(\text{img})) \qquad \text{(formula 3)}$$

Here, intensities Gr(img) of gradient magnetic field Gr in emission line interval $\Delta r$, sampling rate $\Delta t$ and imaging sequence 202 are inputted by an operator as imaging conditions. Peak position calculation processor 118a calculates coordinate (Nr,0) of the peak position in the kr-direction of the first-order component of the echo signal using these imaging conditions inputted by the operator.

The peak position of the first-order component of the echo signal in the phase encode direction (kp-direction) can be calculated in the same manner. When the intensity of gradient magnetic field Gp in the p-direction in tagging sequence 201 is set as Gp(tag) and the application time of gradient magnetic field Gp in the p-direction in tagging sequence 201 is set as "T", emission interval $\Delta p$ which is the distance between the emission lines of stripe pattern obtained on an image by tagging sequence 201 with respect to the kp-direction can be expressed by (formula 4) using application amount (T·Gp(tag)) of gradient magnetic field Gp in the p-direction in tagging sequence 201.

$$\Delta p = 2\pi/(v \cdot T \cdot Gp(\text{tag})) \qquad \text{(formula 4)}$$

Also, the application amount of gradient magnetic field Gp in the p-direction from the original point of the k-space to the generation the echo peak of the first-order component in the echo signal and the application amount of gradient magnetic field Gp in tagging sequence 201 become equal. The application amount of gradient magnetic field Gp in the p-direction in the imaging sequence can be expressed by multiplication of intensity step $\Delta Gp(\text{img})$ per one line in the k-space, step number Np in the k-space based on zero-encode and application time t of gradient magnetic field Gp in the kp-direction, of which the relationship can be expressed by (formula 5).

$$\Delta GP(\text{img}) \cdot Np \cdot t = T \cdot Gp(\text{tag}) \qquad \text{(formula 5)}$$

Step number Np on the k-space of the echo peak in the kp-direction can be expressed by (formula 6) below using (formula 4) and (formula 5).

$$Np = 2\pi/(v \cdot \Delta p \cdot t \cdot \Delta p(\text{img})) \qquad \text{(formula 6)}$$

Here, emission line interval $\Delta p$, intensity step $\Delta GP(\text{img})$ per one line on the k-space in imaging sequence 202 and application time t of gradient magnetic field Gp are inputted by the operator as imaging conditions. Peak position calculation processor 118a calculates step number Np which is the peak position in the kp-direction of the first-order of the echo signal using these imaging conditions inputted by the operator.

As described above, peak position calculation processor 118a calculates the coordinate and step number on the k-space where the peak of the first-order component of the echo signal (higher harmonic) is generated using the interval of the emission lines in the tagging and the imaging conditions of the imaging sequence. The same calculation can be used for the execution of the tagging in the slide direction.

Next, the process of peak range calculation processor 118b will be described. Peak range calculation processor 118b determines the region to be measured for maintaining the image quality of a tagging image or accuracy of strain amount as the measurement requiring region. For that purpose, the data measurement is executed in the present embodiment for determining the measurement requiring region. Hereinafter, this data measurement is referred to as pre-scan in the present description. On the k-space where the measurement data obtained by pre-scan is arranged, in the vicinity of the position where the peak of the first-order component of the echo signal which is calculated by peak position calculation processor 118a is generated, the range (region) having the signal intensity which is more than a predetermined threshold value is determined as the measurement requiring region. FIG. 3(a) is the imaging pulse sequence of pre-scan in the present embodiment. Also, FIG. 3(b) is for explaining the data acquired by the imaging pulse sequence shown in FIG. 3(a). Here, in the imaging pulse sequence of the present embodiment shown in FIG. 2, the case of executing pre-scan upon pseudo-pulse 220 will be exemplified. The places having the same function as shown in FIG. 2 will be appended with the same reference numerals.

In the imaging pulse sequence shown in FIG. 3(a), A/D1 (411) and A/D2(412) respectively indicate the timing of echo acquisition. Peak range calculation processor 118b determines the measurement requiring region in the kr-direction and kp-direction respectively using the data acquired in A/D1 (411) and A/D2(412). Here, the process for determining the measurement requiring region will be described below in the setting that the measurement requiring region in the kr-direction is to be determined using the measurement data acquired at A/D1(411) and the measurement requiring region in the kp-direction is to be determined using the measurement data acquired at A/D2(412).

In pre-scan, gradient magnetic field 404 having the same gradient magnetic field intensity as the gradient magnetic field in the r-direction in imaging sequence 202 is applied in the r-direction. By doing so, the measurement data which coincides with the data on the kr-axis acquired in imaging sequence 202 can be obtained at A/D1(411). In FIG. 3(b), the obtained measurement data is arranged by setting "kr" as the lateral axis and the signal intensity as the longitudinal axis.

First, the measurement region is determined in the kr-direction. The several points in the vicinity of echo peak position (Nr,0) in the kr-direction of the first-order component which is calculated by peak position calculation processor 118a are detected, and data point Nrd wherein signal intensity actually reaches the maximum is extracted from among the detected points. The threshold value is calculated according to the regulations set in advance using signal intensity SI of the extracted data point Nrd. Here, for example, 90% of signal intensity SI of Nrd point is set as the threshold value. Then in the data points in the vicinity of data point Nr, a group of the data points having the absolute value of the signal intensity which is more than the set threshold value (here, more than 0.9SI) is extracted. The difference Wr between the maximum value and the minimum value of the coordinate in the kr-direction of the extracted data point is obtained, and from (Nrd−Wr/2,0) to (Nrd+Wr/2,0) is set as the measurement requiring region in the kr-direction.

In the same manner, in the kp-direction, gradient magnetic field 405 having the same gradient magnetic field intensity as the gradient magnetic field intensity in the p-direction is applied. The data obtained at A/D2(412) is arranged by setting kp as the lateral axis and the signal intensity as the longitudinal axis, and data point Npd wherein the signal intensity actually reaches the maximum is acquired from the several points in the vicinity of echo peak position (Np,0) in the p-direction of the first-order component. Then the width "Wp" of the measurement requiring region in the kp-direction and measurement requiring region (from (0,Npd−Wr/2) to (0, Npd+Wr/2)) are determined from the group of points that are in the vicinity of data point Npd wherein the absolute value of the signal intensity is more than the previously set threshold value.

Coordinates (Nrd−Wr/2,0), (Nrd+Wr/2,0), (0, Npd−Wr/2), (0,Npd+Wr/2) on both ends of the measurement requiring region in the kr-direction and the kp-direction calculated by peak range calculation processor 118b are maintained in a device such as a memory (not shown in the diagram) in computer 118. It may be also configured to maintain data points Nrd and Nrp having the actual maximum signal intensity, and the widths Wr and Wp.

While the case for executing pre-scan upon pseudo-pulse 220 is exemplified above, the timing to execute pre-scan is not limited thereto. For example, it may be configured to execute pre-scan 1 heartbeat before the execution of imaging sequence 202.

Also, in the group of points having higher value of signal intensity than the threshold value which includes point Nrd, the measurement requiring region may be determined as the range from the point which is nearest to the original point in the kr-direction (Wrmin,0) to the point which is farthest from the original point (Wrmax,0) (width: Wrmax−Wrmin), and in the group of points having higher value of signal intensity than the threshold value which includes point Npd, the measurement requiring region may be determined as the range from the point which is nearest to the original point in the kp-direction (Wpmin, 0) to the point which is farthest from the original point (Wpmax,0) (width: Wpmax−Wpmin).

Next, adjustment of an imaging pulse sequence by sequence adjustment processor 118c will be described. Sequence adjustment processor 118c is based on the parallel imaging method, and modifies (adjusts) the imaging pulse sequence so as to measure the measurement requiring region which is calculated by peak range calculation processor 118b without thinning out. In concrete terms, in the present embodiment, the adjustment is made so that the increment of phase encode number becomes 1 (minimum) upon scanning a measurement requiring region.

FIG. 4 is for explaining the relationship between the zero-order component and first-order component of an echo signal and data arrangement on a k-space of the acquired data by the parallel imaging method. FIG. 4(*a*) shows the case of the conventional parallel imaging method, and FIG. 4(*b*) shows the case of the present embodiment.

As shown in FIG. 4(*a*), the measurement is executed by thinning the data in the range between (0,Npd−Wp/2) and (0,Npd+Wp/2) in the conventional parallel imaging method. Therefore, sequence adjustment processor 118c adjusts the phase encode amount so as not to thin out the previously mentioned range as shown in FIG. 4(*b*). In concrete terms, the data in the vicinity of zero-order component (low-frequency region) is acquired by applying the phase encode gradient magnetic field which increments the phase encode step one-by-one, then the data between the measurement requiring region in the kp-direction (Npd−Wp/2,0) to (Npd+Wp/2,0) is acquired by the gradient magnetic field which also increments the phase encode step one-by-one, and the imaging pulse sequence is modified so as to acquire the data of the region from which the data is not yet acquired by incrementing the phase encode step by predetermined numbers. The scanning on the k-space is not limited to the procedure thereof, since the best suited procedures are different due to various factors such as the number of phase encodes, ratio of rectangular visual field or interval for thinning the data.

Figure 5:
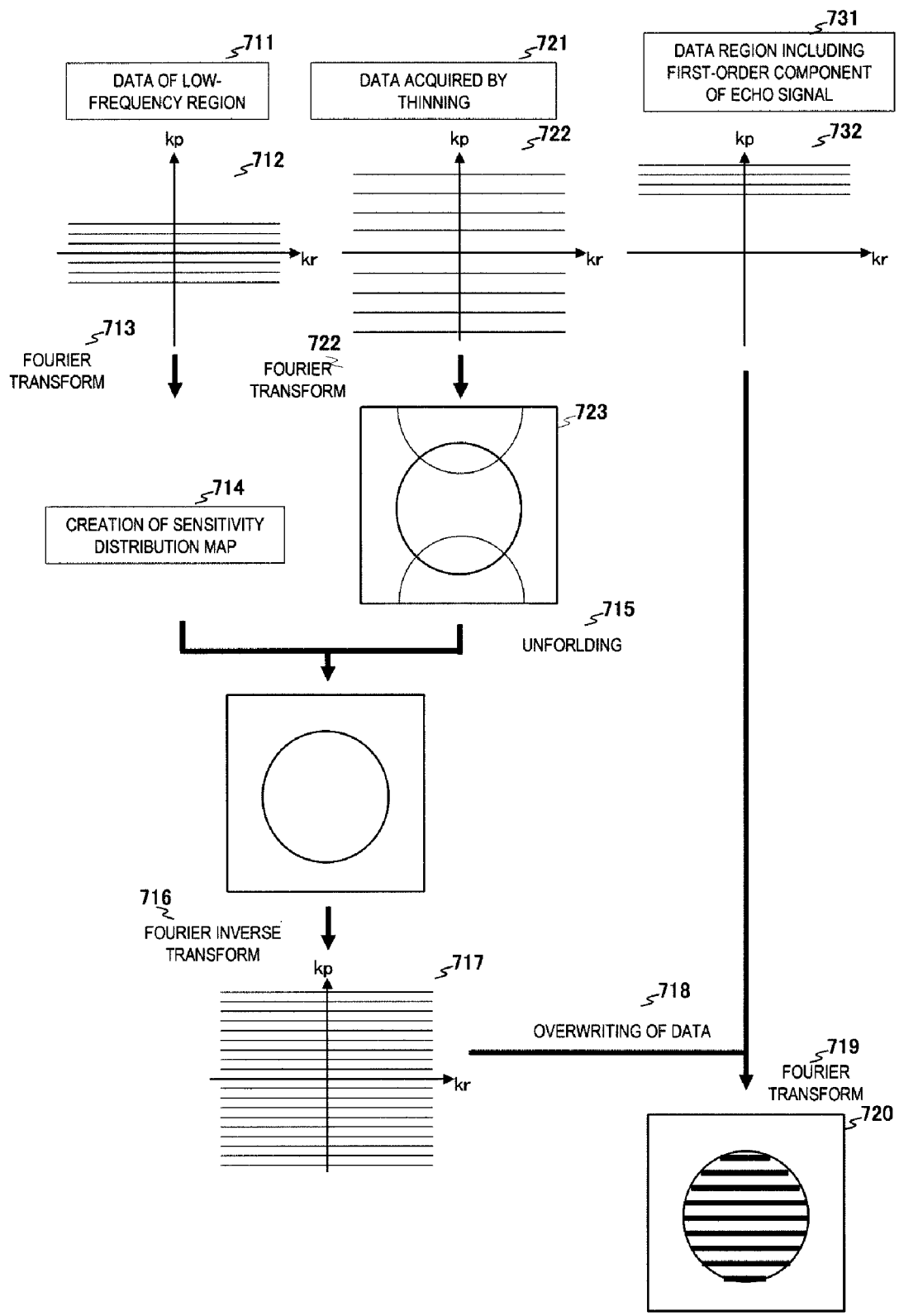
FIG. 5 is for explaining image reconstruction process of the first embodiment.

Next, image reconstruction by image reconstruction processor 118d using the data acquired from the above-described imaging pulse sequence will be described. FIG. 5 is for explaining the procedure for imaging reconstruction process of the present embodiment.

The image reconstruction process in the conventional parallel imaging method comprises a step for extracting the data of a low-frequency region and the thinned out data (steps 711 and 721), a step for obtaining a sensitivity distribution chart using the data of the low-frequency region (step 714), a step for executing the image reconstruction using the thinned out data (step 723) and a step for removing the folding artifact generated upon the image reconstruction using the sensitivity distribution chart (step 715).

In the present embodiment, in addition to the above-mentioned conventional image reconstruction steps, a step for extracting a measurement requiring region (step 731), the step for obtaining k-space data by performing Fourier inverse transform on the image from which the folding artifact is removed (step 717), a step for overwriting the data of the measurement requiring region in the k-space obtained by the Fourier inverse transform using the data measured without thinning the measurement requiring region (step 718), and a step for Fourier transforming the overwritten k-space data (step 719). The image reconstruction process of the present embodiment will be described below following its procedure.

First, image reconstruction processor 118d respectively extracts, from among the obtained data, data 711 of the low-frequency region, data 721 of the entire thinned out region and data 731 including the first-order component of the echo signal (here, the echo signal including the measurement requiring region), and arrange them respectively in the k-space (steps 712, 722 and 732).

Next, image reconstruction processor 118d Fourier transforms data 711 of the low-frequency region (step 713), and calculates sensitivity distribution (creates a sensitivity distribution chart) (step 714). Also, it reconstructs the image having the folding artifact from the thinned out data 721 (step 723).

Image reconstruction processor 118d unfolds the image being folded, using the calculated sensitivity distribution (step 715). Then it performs Fourier inverse transform on the image (step 716) and arranges the data again in the k-space (step 717).

Image reconstruction processor 118d overwrites the k-space data in which the echo signals obtained in the aforesaid step 732 on the region in which the first-order component of the echo signal acquired in step 732 on the k-space data obtained in step 717 (step 718), Fourier transforms the overwritten region (step 719), and reconstructs the image (step 720).

Figure 6:
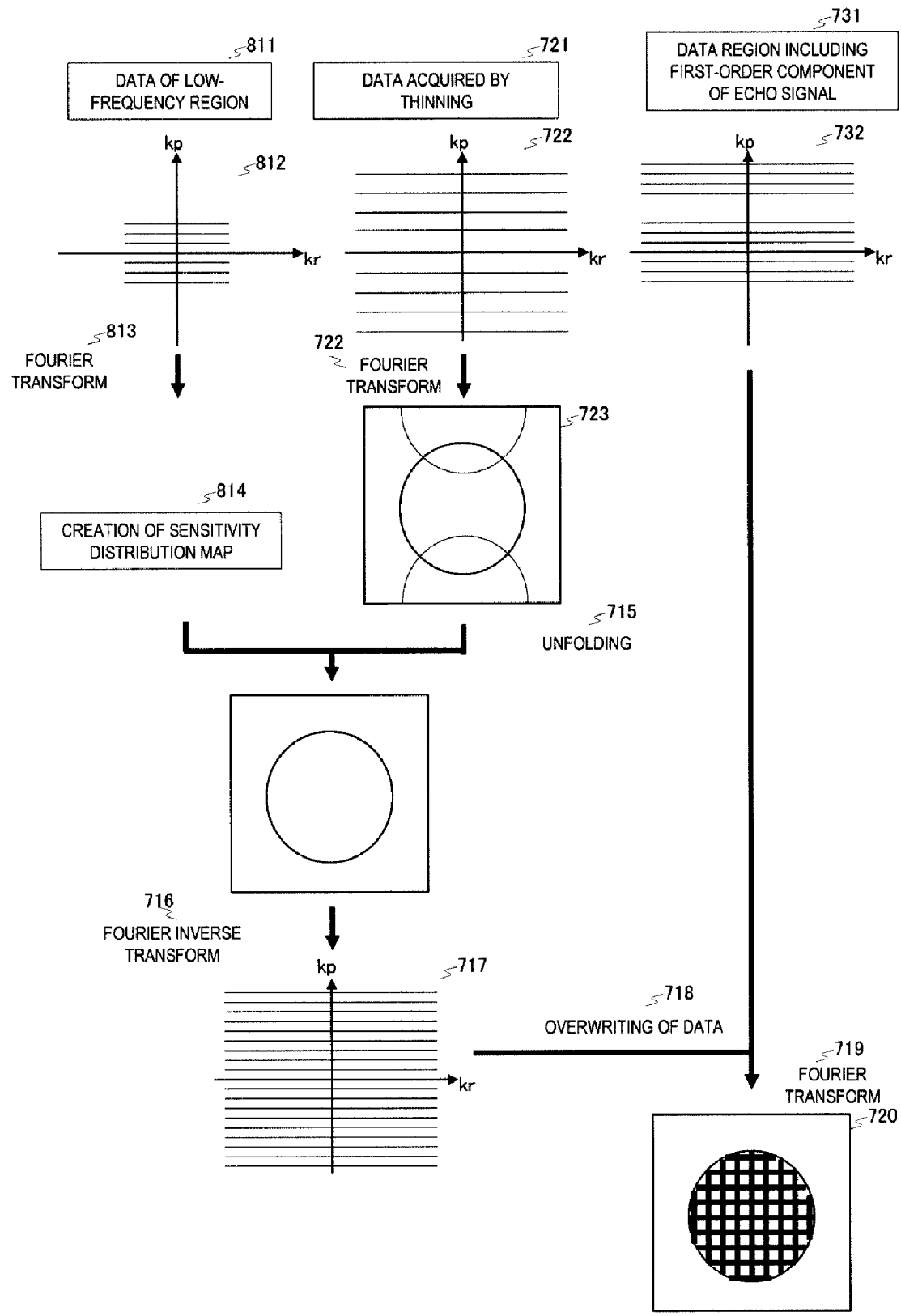
FIG. 6 is for explaining another example of image reconstruction process of the first embodiment.

Generally in the image reconstruction using the parallel imaging method, the region to be used for creation of a sensitivity distribution chart includes a higher harmonic component in the read-out direction (r-direction). In the present embodiment also, there are cases that the first-order component of the echo signal is generated in the r-direction depending on the tagging condition. Therefore, for example, the region to be used for creation of a sensitivity distribution may be limited to the low-frequency region also in the r-direction. The brief overview of the processing of this case is shown in FIG. 6. Hereinafter, the processes which are the same as in FIG. 5 will be appended with the same reference numerals.

Image reconstruction processor 118d respectively extracts, from the acquired echo, data 811 of the low-frequency region, data 721 of the entire thinned-out region and data 731 including the first-order component of the echo signal (here, the echo signal including the data of the range calculated by the peak range calculating function), and respectively arranges them in the k-space (steps 812, 722 and 732). Here, upon extracting data 811 of the low-frequency region, only the low-frequency region is to be extracted also in the r-direction. In the present embodiment, for example, the extraction is limited so that the range from ((Nrd−Wr/2,0) to (Nrd+Wr/2, 0) including the peak of the first-order component of the echo signal in the r-direction calculated by peak range calculation processor 118b and the region symmetrical to the original point in the r-direction are not included. That is, the extraction is limited to extract the data of the range wherein the coordinate in the r-direction is from −(Nrd−Wr/2) to (Nrd−Wr/2).

The image reconstruction processor 118d Fourier transforms the results obtained in step 812 (step 813), and calculates the sensitivity distribution (creates the sensitivity distribution chart) (Step 814). The sequential processing will be the same as the one in FIG. 5 except for using the above-mentioned sensitivity distribution.

As described above, since the tagged data which is orthogonal to the r-direction is not used for creation of the sensitivity distribution chart by limiting the data also in the r-direction upon calculation of the sensitivity distribution, it is possible to remove folding artifacts with high accuracy.

Figure 7:
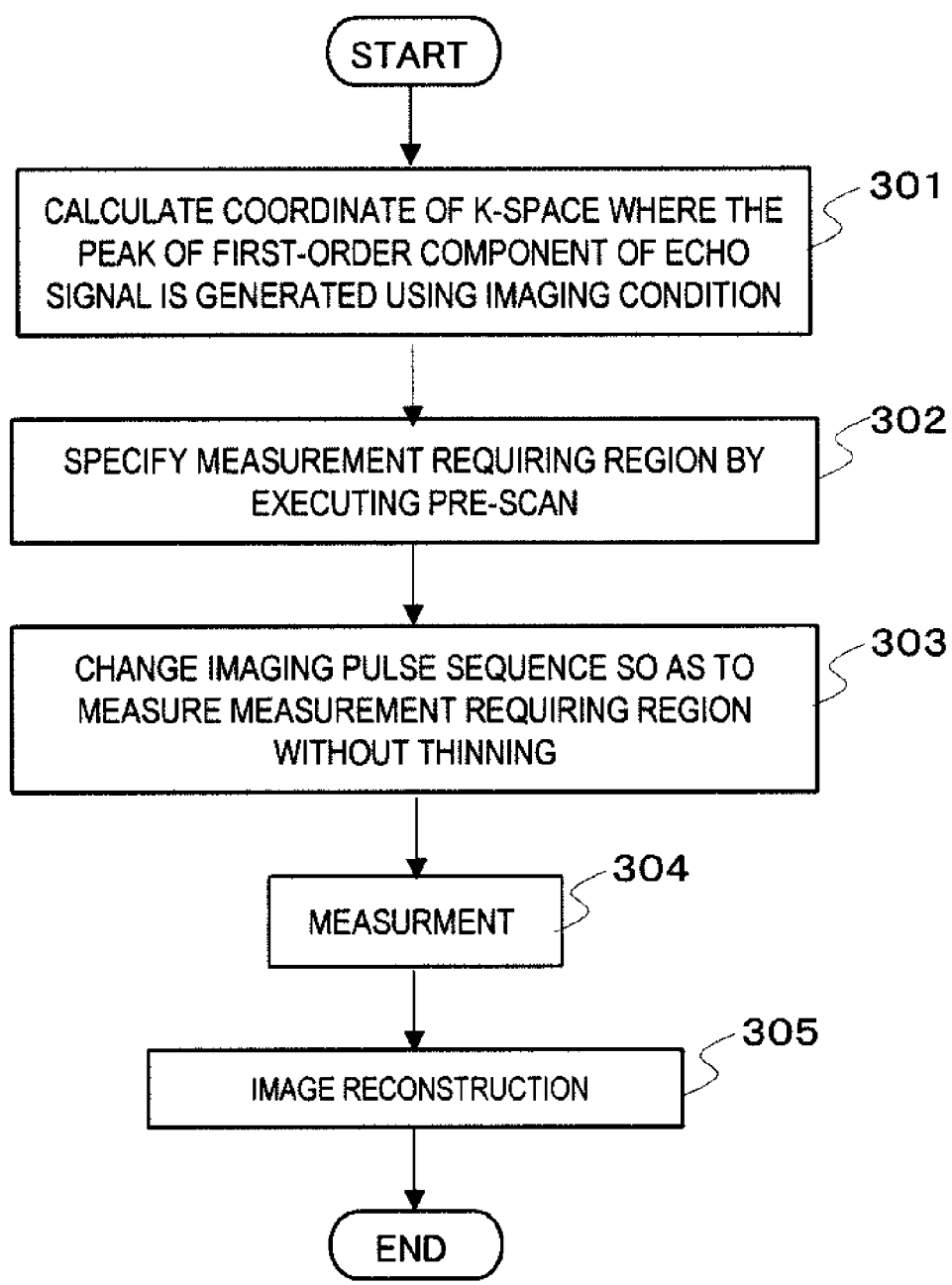
FIG. 7 is the processing flow of image acquisition process of the first embodiment.

Next, the processing flow for image acquisition process by computer 118 in the present embodiment will be described. FIG. 7 is the processing flow of the image acquisition process of the present embodiment. First, when receiving the input of imaging condition from an operator, peak position calculation processor 118a calculates the position where the peak of the first-order component of the echo signal in the kp-direction is generated using the imaging condition (step 301). Next, peak range calculation processor 118b executes pre-scan, and specifies the measurement requiring region (step 302). Then sequence adjustment processor 118c modifies the phase encode amount of the imaging pulse sequence so as to calculate the measurement requiring region without thinning out (step 303). Computer 118 transfers the modified imaging pulse sequence to sequencer 116, and sequencer 116 executes the measurement by operating the respective components in accordance with the transferred sequence (step 304). Image reconstruction processor 118d then reconstructs an image from the acquired echo signal (step 305).

As described above, in accordance with the present embodiment, in the image acquisition sequence including the tagging sequence which is required for measuring the first-order component of the echo signal with high accuracy, it is possible to combine it with the parallel imaging method without causing deterioration of image quality. Therefore, the image acquisition sequence including the tagging sequence can be executed with high speed, and a tagged cine-image can be obtained quickly.

In the present embodiment, peak range calculation processor 118b searches in the vicinity of the peak position which is the result of pre-scan, and calculates the measurement requiring region using the peak position of the first-order component of the echo signal calculated by peak position calculation processor 118a. However, the process by peak position calculation processor 118a may be omitted. In this case, peak range calculation processor 118b may search the data points from the original point toward further in the r-direction and p-direction, and extract data points (Nrd,0) and (0,Npd) wherein the signal intensity reaches the maximum besides the original point.

Also, when the extensity of the echo signal intensity is already found out, the process by peak range calculation processor 118b may be omitted.

Also, while it is configured so that sequence adjustment processor 118c is to reflect the calculated measurement requiring region to the imaging sequence in the above-described embodiment, no limitations are intended to the configuration thereof. It also may be configured so that the data of the measurement requiring region is outputted to a device such as display 119, and the imaging parameter of the imaging sequence is modified so that the measurement requiring region is measured as described above by a user.

Further, while the case that the image acquisition sequence being the cine-imaging sequence is exemplified in the above embodiment, the imaging sequence is not limited thereto.

Also, while the method which measures the data for calculating sensitivity distribution at the same time as measuring the data for an image is exemplified from among the parallel imaging methods in the present embodiment, the method does not have to be limited thereto. The method may be used instead which acquires the measurement of the data for calculating sensitivity distribution upon pre-scan prior to the measurement of the data for an image.

Second Embodiment

Next, the second embodiment of the present invention will be described. The MRI apparatus of the present embodiment is basically the same as the first embodiment. While the parallel imaging method is combined with the image acquisition sequence including the tagging sequence in the first embodiment, the hybrid radial imaging method is to be combined from among the high-speeding methods in the present embodiment.

In the present embodiment also, the method for determining the measurement requiring region by peak position calculation processor 118a and peak range calculation processor 118b is the same as the first embodiment. Since the image reconstruction process by image reconstruction processor 118d is the same as the process of the conventional hybrid radial imaging method, the explanation will be omitted here. The explanation of the second embodiment will be made below focusing on the difference from the first embodiment.

In the present embodiment, the hybrid radial imaging method is combined as previously mentioned. Therefore, the imaging pulse sequence wherein the image acquisition sequence including the tagging sequence is combined with the hybrid radial imaging method is prepared in advance. The hybrid radial imaging method, as shown in FIG. 8(a), includes the radial scanning on the k-space, and reduces the number of acquisition data in the high-frequency region so as to speedup the imaging. Generally in hybrid radial imaging method, the measurement space is sampled by dividing it into a plurality of blocks (referred to as blades) having different sampling directions, and the phase encoding is executed within the blades. The angle formed with the kr-axis is referred to as the blade angle, and the sampling direction is modified as the blade angle is increased by 30-degrees such as 0-degree, 30-degrees, 60-degrees and 90-degrees as shown in FIG. 8(a). The number of times that the blade angle is modified is referred to as the blade number, and the number of times that the phase encode is executed in one blade, that is, the echo number acquired in one blade is referred to as the echo factor. In the example shown in FIG. 8(a), the blade number is 4, and the echo factor is 5. In the present diagram, the zero-order component and first-order component are shown in concentric ellipses drawn by contour lines.

In the present embodiment also, sequence adjustment processor 118c adjusts the imaging pulse sequence so that the measurement requiring region is measured without thinning out. Here, the adjustment is made by the blade angle and echo factor.

As shown in FIG. 8(a), the measurement requiring region exists on the k-space in the kr-axis direction and the kp-axis direction. Therefore, sequence adjustment processor 118c sets the imaging pulse sequence so as to execute the scanning at the blade angles of 0-degree and 90-degrees. As for the echo factor, it is necessary to consider width (Wp) in the kp-direction of the measurement requiring region with respect to the first-order component in the kr-direction, and width (Wr) in the kr-direction of the measurement requiring region with respect to the first-order component in the kp-direction respectively. Sequence adjustment processor 118c compares Wp and Wr, and selects the larger one. For example, as shown in FIG. 8(b), when Wr≧Wp, Wr is selected. Then the selected width (Wr here) is converted into gradient magnetic field application amount, divided by the phase encode step amount between the acquired echoes, and the echo factor which is necessary for obtaining the k-space data of the measurement requiring region is calculated. Then the calculated echo factor is divided by the echo number obtained in one cardiac time phase so as to determine the division number in one blade.

For example, when the echo factor necessary for obtaining the k-space data in the measurement requiring region is 16 and the echo number to be acquired in one cardiac time phase is 5, the division number is determined as 4. Stated another way, by setting acquisition number of one cardiac time phase as 5 and the division number as 4, 20 echoes can be obtained per one blade and the condition of the calculated echo factor can be satisfied.

In accordance with the blade number, the echo factor and the division number within 1 blade which are determined as described above, the k-space scan is determined. Sequence adjustment processor 118c adjusts the imaging pulse sequence so as to satisfy these determined conditions.

The processing flow of the image acquisition process by computer 118 in the present embodiment is basically the same as the one in the first embodiment. In this regard, however, peak position calculation processor 118b calculates the peak position of the first-order of the echo signal in the kr-direction and the kp-direction, and sequence adjustment processor 118c adjusts the imaging pulse sequence by the above-mentioned method.

In the present embodiment, only the width of the measurement requiring region is necessary for the adjustment of the imaging pulse sequence. Therefore, instead of extracting the range having the value more than a predetermined threshold value of the first-order component of the echo signal, by extracting the range having the value more than a predetermined threshold value with respect to the zero-order component of the echo signal obtained in pre-scan, the width Wr0 in the kr-direction and the width Wp0 in the kp-direction may be used instead of Wr and Wp respectively. The extraction is to be executed by peak range calculation processor 118b using the same method as the first embodiment. In this regard, however, the searching region is to be in the vicinity of the original point. It is needless to add that the range of the measurement requiring region may be determined in the vicinity of the high-order component other than zero-order component or the first-order component of the echo signal.

As described above, in accordance with the present embodiment, it is possible to combine the hybrid radial imaging method with the imaging acquisition sequence including the tagging sequence which requires the highly accurate measurement of the first-order component of the echo signal without causing deterioration of image quality. Therefore, the imaging acquisition sequence including the tagging sequence can be executed with high speed, and a tagged cine-image can be obtained quickly without deteriorating image quality.

Even in the case that the object moves during scanning, since the hybrid radial imaging method is combined, it is hardly likely that artifacts which cause streaks on an image in the phase encode direction are generated.

It may be configured also in the present embodiment so that the data of the measurement requiring region is outputted to a device such as displayer 119, and the imaging parameter of the imaging pulse sequence is modified by a user so that the measurement requiring region is calculated as described above.

Third Embodiment

Next, the third embodiment of the present invention will be described. The MRI apparatus of the present embodiment is basically the same as the one in the first embodiment. While the parallel imaging method is combined with the image acquisition sequence including the tagging sequence in the first embodiment, the radial imaging method from among the speed-increasing techniques is to be combined therewith in the present embodiment.

In the present embodiment also, the method for determining the measurement requiring region by peak position calculation processor 118a and peak range calculation processor 118b is the same as the one in the first embodiment. The explanation of the image reconstruction process by image reconstruction processor 118d will be omitted here, since it is the same as the process of the conventional radial imaging method. The present embodiment will be described below focusing on the difference from the first embodiment.

In the present embodiment, the radial imaging method is combined with the image acquisition sequence as described above. Therefore, the imaging sequence wherein the radial imaging method is combined in advance with the image acquisition sequence including the tagging sequence is prepared. The radial imaging method speeds up the imaging by scanning the k-space radially and reducing the acquisition data number of the high-frequency region as shown in FIG. 9(a). Generally in the radial imaging method, the sampling of the measurement space in a radial pattern is executed by measuring while modifying both of the phase encode gradient magnetic field and the readout gradient magnetic field for each measurement of one echo signal. The sampling direction is the angle formed with the kr-axis in the k-space, and is indicated by θ.

In the present embodiment, as shown in FIG. 9(b), sequence adjustment processor 118c determines the gradient magnetic field application amount so as to scan densely in the measurement requiring region. First, in the same manner as the second embodiment, sequence adjustment processor 118c compares Wp and Wr, and selects the larger one. For example, when Wr≧Wp, Wr is to be selected. Then the condition such as imaging parameter is determined so as to execute scan densely between −arctan((Wr/2)/Npd)≦θ≦arctan((Wr/2)/Npd) and −arctan ((Wr/2)/Npd)+π/2≦θ≦arctan((Wr/2)/Npd)+π/2, and to scan appropriately in the other regions. The imaging pulse sequence is then adjusted so as to satisfy the determined condition.

As for the order of scan in the k-space, for example, the echo signal in the vicinity of the kr-axis is obtained first in the above-mentioned condition, and the echo signal in the vicinity of the kp-axis is obtained. After that, the echo signal in the region apart from both of the coordinate axes is obtained by normal sampling angle θ0 and increment angle θi. It is needless to say that the scan order is not limited thereto.

The image acquisition process of the present embodiment is basically the same as the image acquisition process in the second embodiment. In this regard, however, in step 303 of FIG. 7, the content to be adjusted by sequence adjustment processor 118c is different.

As described above, in accordance with the present embodiment, the radial imaging method can be combined with the image acquisition sequence including the tagging sequence which requires the highly accurate measurement of the first-order component of the echo signal without compromising image quality. Therefore, the imaging acquisition sequence including the tagging sequence can be executed with high speed, and a tagged cine-image can be obtained quickly.

Even in the case that the object moves during imaging, since the radial imaging method is combined, it is hardly likely that artifacts which cause streaks on an image in the phase encode direction are generated.

It may be configured also in the present embodiment so that the data of the measurement requiring region is outputted to a device such as displayer 119, and imaging parameter of the imaging pulse sequence is modified by a user so that the measurement requiring region is calculated as described above.

Fourth Embodiment

Next, the fourth embodiment of the present invention will be described. The MRI apparatus of the present embodiment is basically the same as the one in the first embodiment. While the parallel imaging method is combined with the image acquisition sequence including the tagging sequence in the first embodiment, the spiral imaging method from among the speed-increasing techniques is to be combined therewith in the present embodiment.

In the present embodiment also, the method for determining the measurement requiring region by peak position calculation processor 118a and peak range calculation processor 118b is the same as the one in the first embodiment. The explanation on the image reconstruction process by image reconstruction processor 118d will be omitted here, since it is the same as the process of the conventional spiral imaging method. The present embodiment will be described below focusing on the difference from the first embodiment.

In the present embodiment, the spiral imaging method will be applied as described above. Therefore, the imaging sequence wherein the spiral imaging method is combined in advance with the image acquisition sequence including the tagging sequence is prepared. In the spiral imaging method, data is collected by sampling an echo while applying the phase encode gradient magnetic field and the readout gradient magnetic field so as to form the trajectory which spreads in the spiral manner from the central portion to the end portion of the k-space.

In the present embodiment, sequence adjustment processor 118c modifies the application amount of the phase encode gradient magnetic field and the readout gradient magnetic field so as to scan densely in the measurement requiring region.

The normal spiral imaging method scans the k-space in a spiral manner using the oscillating gradient magnetic field wherein the oscillation increases gradually in the phase encode direction and the readout direction respectively, and the degree of oscillation increase usually stays constant. In the present embodiment, upon scanning the measurement requiring region, the measurement requiring region is measured densely by adjusting the degree of increase of this gradient magnetic field oscillation to be smaller than the reference degree of increase. In concrete terms, with respect to the measurement requiring region in the r-direction, degree of increase from the point wherein the intensity of the gradually increasing readout gradient magnetic field reaches the intensity equivalent to one end of the measurement requiring region in the r-direction (the end on the side closer to the origin) to the point wherein the intensity of the gradually increasing readout gradient magnetic field reaches the intensity equivalent to the other end of the measurement requiring region (the end on the side farther from the origin) is set to be smaller than the reference degree of increase, and the degree of increase of the phase encode gradient magnetic field is also modified in the same manner. As a result, the width of scan in the radial direction becomes narrow in the spiral region including the measurement requiring region, and the density of data measurement is increased. Also with respect to the measurement requiring region in the p-direction, the degree of increase of the intensity range wherein the phase encode gradient magnetic field is equivalent to the measurement requiring region in the p-direction is to be set smaller the reference degree of increase, and the degree of increase in intensity of the gradient magnetic field in the readout direction is to be modified in the same manner.

Meantime, depending on the form of the spiral or the coordinate of the measurement requiring region in the r-direction and the p-direction, it is possible to scan so as to include the measurement requiring region in both directions. For example, when the coordinate of both ends of the measurement requiring region in the r-direction is set as (Nrd−Wr/2,0), (Nrd+Wr/2,0), the coordinate of both ends of the measurement requiring region in the p-direction is set as (Npd−Wp/2,0), (Npd+Wp/2,0), the one having the smaller value out of Nrd−Wr/2 and Npd−Wp/2 is set as Wmin, and the one having the larger value out of Nrd+Wr/2 and Npd+Wp/2 is set as Wmax, it may be configured to set the degree of increase of intensity of the gradient magnetic field in the r-direction and the p-direction small between Wmin and Wmax.

As described above, in accordance with the present embodiment, it is possible to combine the spiral imaging method with the image acquisition sequence including the tagging sequence which requires the highly accurate measurement of the first-order component of the echo signal without causing the deterioration of image quality. Therefore, the imaging acquisition sequence including the tagging sequence can be executed with high speed, and a tagged cine-image can be obtained quickly without deteriorating image quality.

Even in the case that the object moves during imaging, since the spiral imaging method is combined, it is hardly likely that the artifacts are generated wherein the images have streaks in the phase encode direction.

It may be configured also in the present embodiment so that the data of the measurement requiring region is outputted to a device such as displayer 119, and the imaging parameter of the imaging pulse sequence is modified by a user so that the measurement requiring region is calculated as described above.

The invention claimed is:

1. A magnetic resonance imaging apparatus comprising:
static magnetic field generation means configured to generate a static magnetic field;
gradient magnetic field generation means configured to generate a gradient magnetic field in a plurality of axes directions;
high-frequency magnetic field generation means configured to irradiate a high-frequency magnetic field to an object to be imaged;
signal detection means configured to detect a nuclear magnetic resonance signal produced from the object to be imaged;
control means configured to control the operation of the gradient magnetic field generation means, the high-frequency magnetic field generation means and the signal detection means so as to acquire data in k-space by executing a predetermined imaging pulse sequence; and
arithmetic processing means configured to perform image reconstruction by executing arithmetic processing with respect to the k-space data, wherein:
the imaging pulse sequence includes a tagging sequence for modulating nuclear magnetization of the object to be imaged and an imaging sequence for making a part of the k-space data not to be measured;
the control means comprises measurement requiring region specification means configured to specify the measurement region in the k-space (measurement requiring region) required for reflecting the effect of the modulated nuclear magnetization on the image to be reconstructed and sequence modification means configured to modify the relevant imaging sequence so that the measurement region specified by the measurement requiring region specification means is to be measured upon executing the imaging sequence;
the measurement requiring region includes the position having the maximum value of the signal intensity in the kr-direction and the kp-direction other than the original point and is the closest position to the original point (echo peak) in the k-space; and
the measurement requiring region specification means comprises echo peak position calculation means configured to calculate the echo peak generation position from the imaging parameter of the imaging sequence.

2. The magnetic resonance imaging apparatus according to claim 1, wherein the measurement requiring region specification means specifies the measurement requiring region based on the result obtained from the data measurement executed separately from the imaging sequence.

3. The magnetic resonance imaging apparatus according to claim 1, wherein the pre-scan is executed by the same gradient magnetic field condition for application as the one of the imaging sequence.

4. The magnetic resonance imaging apparatus according to claim 1, wherein the sequence modification means of the control means, upon each measurement of the measurement requiring region, modifies the imaging sequence to increment a phase encode amount by one and repeats measurement of the measurement requiring region, until measurements for a predetermined number of phase encodes are performed, so that the measurement region is measured without thinning.

5. The magnetic resonance imaging apparatus according to claim 1, wherein the sequence modification means of the control means, to perform measurement of another region other than the measurement requiring region, modifies the imaging sequence in each instance by incrementing a phase encode by a predetermined amount and repeats measurement of said another region, until measurements of said another region for a predetermined number of phase encodes are performed, so that said another region is measured with thinning.

6. The magnetic resonance imaging apparatus according to claim 1, wherein the arithmetic processing means extracts, from the acquired data, (i) low-frequency region data of a low frequency region, (ii) thinned-out region data and (iii) data including first order component of the echo signal, performs unfolding processing based on the thinned-out region data and based on sensitivity distribution calculated from the low-frequency region data, overwrites the data including the first order component of the echo signal on the unfolding processed data to generate overwritten data, Fourier transforms the overwritten data to reconstruct an image.

7. The magnetic resonance imaging apparatus according to claim 6, wherein the low frequency region that is used for calculating the sensitivity distribution is limited both in the kp-direction and in the kr-direction.

8. A magnetic resonance imaging apparatus comprising:
static magnetic field generation means configured to generate a static magnetic field;
gradient magnetic field generation means configured to generate a gradient magnetic field in a plurality of axes directions;
high-frequency magnetic field generation means configured to irradiate a high-frequency magnetic field to an object to be imaged;
signal detection means configured to detect a nuclear magnetic resonance signal produced from the object to be imaged;
control means configured to control the operation of the gradient magnetic field generation means, the high-frequency magnetic field generation means and the signal detection means so as to acquire data in k-space by executing a predetermined imaging pulse sequence; and
arithmetic processing means configured to perform image reconstruction by executing arithmetic processing with respect to the k-space data, wherein:
the imaging pulse sequence includes a tagging sequence for modulating nuclear magnetization of the object to be imaged and an imaging sequence for making a part of the k-space data not to be measured;
the control means comprises measurement requiring region specification means configured to specify the measurement region in the k-space (measurement requiring region) required for reflecting the effect of the modulated nuclear magnetization on the image to be reconstructed and sequence modification means configured to modify the relevant imaging sequence so that the measurement region specified by the measurement requiring region specification means is to be measured upon executing the imaging sequence;
the measurement requiring region includes the position having the maximum value of the signal intensity in the kr-direction and the kp-direction other than the original point and is the closest position to the original point (echo peak) in the k-space; and the measurement requiring region specification means comprises echo peak position calculation means configured to calculate the echo peak generation position from the imaging parameter of the aging sequence, and wherein the measurement requiring region specification means specifies the measurement requiring region in the vicinity of the echo peak generation position calculated by the echo peak position calculation means.

9. The magnetic resonance imaging apparatus according to claim 1, wherein the imaging sequence makes a part of the measurement data required for image reconstruction not to be measured, by one of the parallel imaging method, radial imaging method, hybrid radial imaging method or spiral imaging method.

10. A magnetic resonance imaging apparatus comprising:
static magnetic field generation means configured to generate a static magnetic field;
gradient magnetic field generation means configured to generate a gradient magnetic field in a plurality of axes directions;
high-frequency magnetic field generation means configured to irradiate a high-frequency magnetic field to an object to be imaged;
signal detection means configured to detect a nuclear magnetic resonance signal produced from the object to be imaged;
control means configured to control the operation of the gradient magnetic field generation means, the high-frequency magnetic field generation means and the signal detection means so as to acquire data in k-space by executing a predetermined imaging pulse sequence; and
arithmetic processing means configured to perform image reconstruction by executing arithmetic processing with respect the k-space data, wherein:
the imaging pulse sequence includes a tagging sequence for modulating nuclear magnetization of the object be imaged and an imaging sequence for king a part of the k-space data not to be measured;
the control means comprises measurement requiring region specification means configured to specify the measurement region in the k-space (measurement requiring region) required for reflecting the effect of the modulated nuclear magnetization on the image to be reconstructed and sequence modification means configured to modify the relevant imaging sequence so that the measurement region specified by the measurement requiring region specification means is to be measured upon executing the imaging sequence;
the tagging sequence synchronizes with a biological signal acquired from the object to be imaged, and modulates spatial distribution of a nuclear magnetic resonance signal; and
the imaging sequence executes the cine-imaging sequence for imaging a plurality of images having different passages of time from the biological signal, during the period of plural cardiac beats.

* * * * *